(12) United States Patent
Echikawa et al.

(10) Patent No.: US 11,322,830 B2
(45) Date of Patent: May 3, 2022

(54) SUBSTRATE EQUIPPED WITH ANTENNA AND ANTENNA MODULE

(71) Applicant: Murata Manufacturing Co., Ltd., Kyoto (JP)

(72) Inventors: Yoshitaka Echikawa, Kyoto (JP); Issei Yamamoto, Kyoto (JP); Ikuo Deguchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 160 days.

(21) Appl. No.: 16/931,817

(22) Filed: Jul. 17, 2020

(65) Prior Publication Data
US 2020/0350667 A1 Nov. 5, 2020

Related U.S. Application Data

(63) Continuation of application No. PCT/JP2019/000879, filed on Jan. 15, 2019.

(30) Foreign Application Priority Data

Jan. 18, 2018 (JP) .............................. JP2018-006428

(51) Int. Cl.
*H01Q 1/38* (2006.01)
*H05K 1/02* (2006.01)

(52) U.S. Cl.
CPC .............. *H01Q 1/38* (2013.01); *H05K 1/0243* (2013.01); *H05K 2201/0183* (2013.01); *H05K 2201/10098* (2013.01)

(58) Field of Classification Search
CPC .......... H01Q 1/22; H01Q 1/38; H05K 1/0243; H05K 2201/10098
See application file for complete search history.

(56) References Cited

U.S. PATENT DOCUMENTS 10,446,919 B2* 10/2019 Shiozaki ................ H01Q 1/005
2008/0266178 A1 10/2008 Tiezzi et al.
(Continued)

FOREIGN PATENT DOCUMENTS

JP   H03173203 A   7/1991
JP   2001298321 A  10/2001
(Continued)

OTHER PUBLICATIONS

International Search Report issued in Application No. PCT/JP2019/000879, dated Mar. 19, 2019.
(Continued)

*Primary Examiner* — Hasan Z Islam
(74) *Attorney, Agent, or Firm* — Pearne & Gordon LLP

(57) ABSTRACT

A substrate equipped with an antenna of the present disclosure includes a circuit substrate and an antenna element. When viewed from a thickness direction, an area of one principal surface of the circuit substrate is larger than that of another principal surface thereof, and each of the one principal surface and the other principal surface of the circuit substrate is formed in a rectangular shape. When a maximum width between a first outer periphery of the other principal surface projected onto the one principal surface and a first outer periphery of the one principal surface is defined as $W_1$, the antenna element is mounted in at least part of a region on the one principal surface of the circuit substrate, in which the region has the width $W_1$ from the second outer periphery of the other principal surface projected onto the one principal surface toward the inner side.

20 Claims, 7 Drawing Sheets

(56) References Cited

U.S. PATENT DOCUMENTS

2017/0229784 A1\* 8/2017 Kitamura ........... H01Q 21/0025
2018/0210337 A1 7/2018 Wakita et al.

FOREIGN PATENT DOCUMENTS

| JP | 2003283239 A | 10/2003 |
| JP | 2008515253 A | 5/2008 |
| JP | 2011035493 A | 2/2011 |
| WO | 2017030070 A1 | 2/2017 |

OTHER PUBLICATIONS

Written Opinion issued in Application No. PCT/JP2019/000879, dated Mar. 19, 2019.

\* cited by examiner

SUBSTRATE EQUIPPED WITH ANTENNA AND ANTENNA MODULE

This is a continuation of International Application No. PCT/JP2019/000879 filed on Jan. 15, 2019 which claims priority from Japanese Patent Application No. 2018-006428 filed on Jan. 18, 2018. The contents of these applications are incorporated herein by reference in their entireties.

BACKGROUND OF THE DISCLOSURE

Field of the Disclosure

The present disclosure relates to a substrate equipped with an antenna and an antenna module.

Description of the Related Art

As a method for manufacturing a substrate equipped with an antenna in which an antenna element is mounted on the substrate, for example, Patent Document 1 discloses a technique in which an antenna element is formed by patterning metal foil, such as copper foil or aluminum foil, by photolithography. Specifically, resist is applied onto the metal foil, and then etching is performed on the metal foil so that a portion of the metal foil that is not covered with the resist is removed; thereafter, the resist is removed.

Patent Document 1: International Publication No. WO 2017/030070

BRIEF SUMMARY OF THE DISCLOSURE

As an area of an antenna element mounted on a substrate is larger, antenna characteristics are improved. However, for example, in the case where an antenna element is formed by photolithography, variations in etching accuracy, resist application accuracy, and the like are generated, and therefore it is necessary to secure a space for absorbing a component tolerance, a process tolerance, and the like on a surface of a substrate. Because of this, a space for disposing the antenna element on the surface of the substrate is limited, so that it is impossible to dispose the antenna element while being fully extended to an outer edge of the substrate. As described above, in the structure of the substrate equipped with the antenna of the related art, there is a problem that the antenna characteristics may not be sufficiently improved, and the degree of freedom in design is low.

The present disclosure has been conceived to solve the above-described problem, and an object of the present disclosure is to provide a substrate equipped with an antenna having a large area in which an antenna element is allowed to be mounted, and securing a space for mounting other electronic components when the substrate equipped with the antenna is mounted as an antenna module on a mounting substrate. Another object of the present disclosure is to provide an antenna module in which an electronic component is mounted on the substrate equipped with the antenna.

A substrate equipped with an antenna of the present disclosure includes a circuit substrate having one principal surface and the other principal surface, and an antenna element mounted on the one principal surface of the circuit substrate. When viewed from a thickness direction, an area of the one principal surface is larger than an area of the other principal surface of the circuit substrate. Each of the one principal surface and the other principal surface of the circuit substrate is formed in a rectangular shape, and includes a first outer periphery and a second outer periphery in pairs extending along a first direction and a third outer periphery and a fourth outer periphery in pairs extending along a second direction. When a maximum width in the second direction between the first outer periphery of the other principal surface projected onto the one principal surface and the first outer periphery of the one principal surface is defined as $W_1$, the antenna element is mounted in at least part of a region on the one principal surface of the circuit substrate, in which the region has the width $W_1$ from the second outer periphery of the other principal surface projected onto the one principal surface toward an inner side in the second direction.

In the substrate equipped with the antenna of the present disclosure, when a maximum width in the second direction between the second outer periphery of the other principal surface projected onto the one principal surface and the second outer periphery of the one principal surface is defined as $W_2$, it is preferable that the antenna element be mounted in at least part of a region on the one principal surface of the circuit substrate, in which the region has the width $W_2$ from the first outer periphery of the other principal surface projected onto the one principal surface toward an inner side in the second direction.

In the substrate equipped with the antenna of the present disclosure, an end portion of the antenna element may overlap at least the second outer periphery of the other principal surface projected onto the one principal surface when viewed from the thickness direction.

In the substrate equipped with the antenna of the present disclosure, end portions of the antenna element may overlap, at least, the first outer periphery and the second outer periphery of the other principal surface projected onto the one principal surface when viewed from the thickness direction.

In the substrate equipped with the antenna of the present disclosure, the antenna element may not stick out to an outer side portion relative to the other principal surface projected onto the one principal surface when viewed from the thickness direction.

In one embodiment, the circuit substrate includes a dielectric layer constituting the one principal surface, and a base material layer constituting the other principal surface. The dielectric layer has a relative dielectric constant lower than that of the base material layer. The dielectric layer has a central portion in contact with the base material layer, and a circumferential edge portion located in an outer side portion relative to the central portion.

It is preferable for the circumferential edge portion to be thinner than the central portion. The circumferential edge portion may have the same thickness as the central portion.

In one embodiment, the circuit substrate includes a dielectric layer constituting the one principal surface and the other principal surface.

It is preferable that the dielectric layer be formed by laminating a plurality of layers.

The dielectric layer may be formed by laminating two or more kinds of layers having different relative dielectric constants, and the relative dielectric constant of the layer constituting the one principal surface may be lowest in the dielectric layer.

In the substrate equipped with the antenna of the present disclosure, it is preferable that a step portion between a projecting portion and a non-projecting portion of the circuit substrate have a chamfered shape.

An antenna module of the present disclosure is an antenna module that includes a substrate equipped with an antenna in which an antenna element is mounted on one principal surface of a circuit substrate, and an electronic component mounted on the substrate equipped with the antenna, wherein the substrate equipped with the antenna is the substrate equipped with the antenna of the present disclosure.

In the antenna module of the present disclosure, it is preferable that the electronic component be mounted on the other principal surface of the circuit substrate.

According to the present disclosure, it is possible to provide a substrate equipped with an antenna having a large area in which an antenna element is allowed to be mounted, and securing a space for mounting other electronic components when the substrate equipped with the antenna is mounted as an antenna module on a mounting substrate.

DETAILED DESCRIPTION OF THE DISCLOSURE

Hereinafter, a substrate equipped with an antenna, and an antenna module of the present disclosure will be described.

However, the present disclosure is not limited to the following configurations, and it is possible to make and apply modifications appropriately in a range without changing the spirit of the present disclosure. Note that a combination of two or more of the desirable configurations of the present disclosure described below is also included in the present disclosure.

[Substrate Equipped with Antenna]

In a substrate equipped with an antenna of the present disclosure, when viewed from a thickness direction thereof, an area of one principal surface is larger than an area of the other principal surface of a circuit substrate; each of the one principal surface and the other principal surface of the circuit substrate is formed in a rectangular shape, and respectively includes a first outer periphery and a second outer periphery in pairs extending along a first direction and a third outer periphery and a fourth outer periphery in pairs extending along a second direction.

When a maximum width in the second direction between the first outer periphery of the other principal surface projected onto the one principal surface and the first outer periphery of the one principal surface is defined as $W_1$, an antenna element is mounted in at least part of a region on the one principal surface of the circuit substrate, in which the region has the width $W_1$ from the second outer periphery of the other principal surface projected onto the one principal surface toward an inner side in the second direction.

The embodiments described below are examples, and it goes without saying that partial substitutions or combinations of the configurations described in the different embodiments can be carried out. In the second and subsequent embodiments, descriptions of the items common to the first embodiment will be omitted, and only different points will be described. In particular, the same effects obtained by the same configurations will not be described one by one for each embodiment.

First Embodiment

In a first embodiment of the present disclosure, a circuit substrate includes a dielectric layer constituting one principal surface and a base material layer constituting the other principal surface, and a circumferential edge portion of the dielectric layer is thinner than a central portion thereof.

Figure 1:
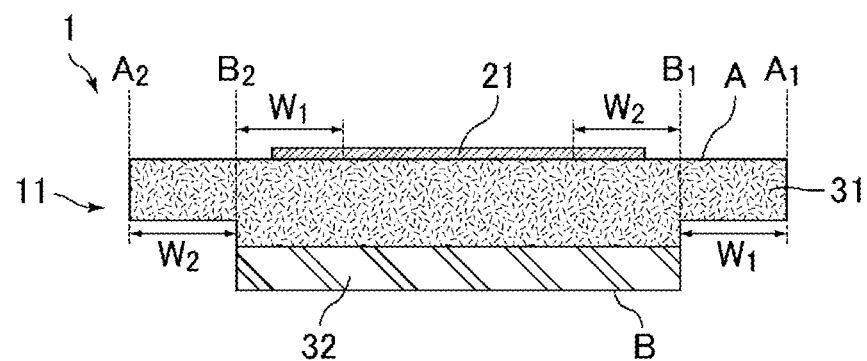
FIG. 1 is a cross-sectional view schematically illustrating an example of a substrate equipped with an antenna according to a first embodiment of the present disclosure.

FIG. 1 is a cross-sectional view schematically illustrating an example of a substrate equipped with an antenna according to the first embodiment of the present disclosure.

A substrate equipped with an antenna 1 illustrated in FIG. 1 includes a circuit substrate 11 and an antenna element 21. The circuit substrate 11 has one principal surface A and the other principal surface B, and the antenna element 21 is mounted on the one principal surface A of the circuit substrate 11. The circuit substrate 11 includes a dielectric layer 31 constituting the one principal surface A, and a base material layer 32 constituting the other principal surface B.

Although not illustrated in FIG. 1, a desired circuit is formed in or on the substrate equipped with the antenna 1.

In the substrate equipped with the antenna 1 illustrated in FIG. 1, when viewed from the thickness direction (an upper-lower direction in FIG. 1), an area of the one principal surface A of the circuit substrate 11 is larger than that of the other principal surface B thereof. Therefore, the circuit substrate 11 is provided with a portion where the one principal surface A projects outward relative to the other principal surface B.

"The other principal surface of the circuit substrate" refers to a surface located farthest away from the one principal surface of the circuit substrate among the surfaces on the side opposite to the one principal surface of the circuit substrate on which the antenna element is mounted. Therefore, a surface on the rear side of the projecting portion of the circuit substrate is not included in the other principal surface of the circuit substrate.

Figure 2:
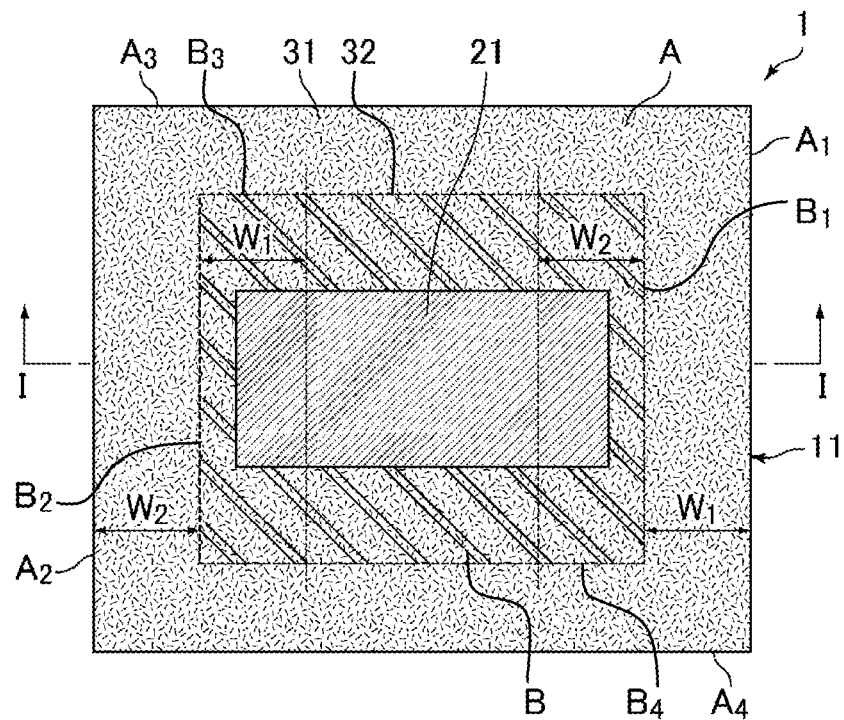
FIG. 2 is a plan view of the substrate equipped with the antenna illustrated in FIG. 1 when viewed from a thickness direction.

FIG. 2 is a plan view of the substrate equipped with the antenna illustrated in FIG. 1 when viewed from the thickness direction. FIG. 1 corresponds to a cross-sectional view taken along a line I-I of the substrate equipped with the antenna illustrated in FIG. 2.

As illustrated in FIG. 2, in the substrate equipped with the antenna 1, each of the one principal surface A and the other principal surface B of the circuit substrate 11 is formed in a rectangular shape. The one principal surface A of the circuit substrate 11 includes a first outer periphery $A_1$ and a second outer periphery $A_2$ in pairs extending along a first direction (upper-lower direction in FIG. 2) and a third outer periphery $A_3$ and a fourth outer periphery $A_4$ in pairs extending along a second direction (right-left direction in FIG. 2), while the other principal surface B of the circuit substrate 11 includes a first outer periphery $B_1$ and a second outer periphery $B_2$ in pairs extending along the first direction and a third outer periphery $B_3$ and a fourth outer periphery $B_4$ in pairs extending along the second direction.

In the substrate equipped with the antenna 1 illustrated in FIGS. 1 and 2, when a maximum width in the second direction (right-left direction in FIGS. 1 and 2) between the first outer periphery $B_1$ of the other principal surface B projected onto the one principal surface A and the first outer periphery $A_1$ of the one principal surface A is defined as $W_1$, the antenna element 21 is mounted in part of a region on the one principal surface A of the circuit substrate 11, in which the region has the width $W_1$ (hereinafter also referred to as a $W_1$ region) from the second outer periphery $B_2$ of the other principal surface B projected onto the one principal surface A toward the inner side in the second direction.

In the substrate equipped with the antenna 1 illustrated in FIGS. 1 and 2, when a maximum width in the second direction between the second outer periphery $B_2$ of the other principal surface B projected onto the one principal surface A and the second outer periphery $A_2$ of the one principal surface A is defined as $W_2$, the antenna element 21 is mounted in part of a region on the one principal surface A of the circuit substrate 11, in which the region has the width $W_2$ (hereinafter also referred to as a $W_2$ region) from the first outer periphery $B_1$ of the other principal surface B projected onto the one principal surface A toward the inner side in the second direction.

As described earlier, in the structure of the substrate equipped with the antenna of the related art, because it is necessary to secure a space for absorbing the component tolerance, the process tolerance, and the like on the substrate surface, there is a problem that the antenna characteristics may not be sufficiently improved, and the degree of freedom in design is low. In contrast, in the structure of the substrate equipped with the antenna as illustrated in FIGS. 1 and 2, by absorbing the above-mentioned tolerances in the projecting portion of the circuit substrate, it is possible to dispose the antenna element even in the region in which the antenna element may not be disposed in the structure of the related art. Accordingly, it is possible to increase the area in which the antenna element may be mounted, and to improve the antenna characteristics.

When an antenna module is produced by using the substrate equipped with the antenna as discussed above, there exists a space below the projecting portion of the circuit substrate. Due to this, when the above antenna module is mounted on a mounting substrate, a space for mounting other electronic components is secured, and it is possible to effectively utilize the space on the mounting substrate.

In the substrate equipped with the antenna according to the first embodiment of the present disclosure, the antenna element may be mounted in a region other than the $W_1$ region as long as the antenna element is mounted in at least part of the $W_1$ region. The size, shape, and the like of the antenna element are not particularly limited, and the location at which the antenna element is mounted on one principal surface of the circuit substrate is also not particularly limited. For example, the antenna element may be mounted in a central portion of one principal surface of the circuit substrate, or may be mounted in an end portion of the one principal surface of the circuit substrate.

The antenna element may be formed of a single pattern or may be formed of a plurality of patterns.

In the substrate equipped with the antenna according to the first embodiment of the present disclosure, it is sufficient that the antenna element is mounted in at least part of the $W_1$ region. In other words, the antenna element may be mounted in part of the $W_1$ region, or may be mounted in all of the $W_1$ region.

In this specification, "the antenna element is mounted in all of the $W_1$ region" means that at least part of an end portion of the antenna element 21 overlaps the second outer periphery $B_2$ of the other principal surface B projected onto the one principal surface A. The same applies to the $W_2$ region and the like, which will be described later.

Figure 3:
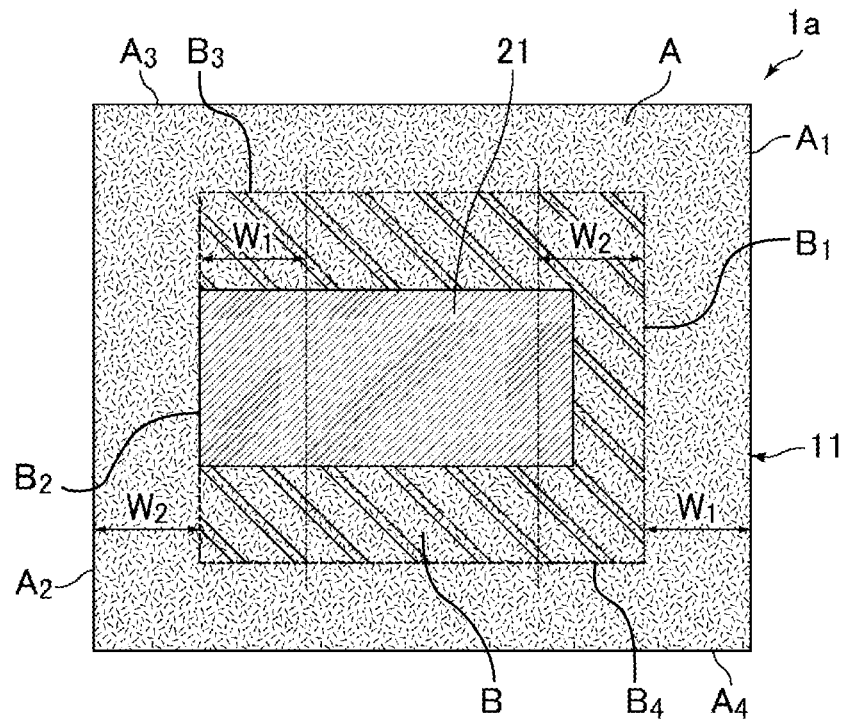
FIG. 3 is a plan view schematically illustrating an example of a substrate equipped with an antenna in which an antenna element is mounted in all of a $W_1$ region in the first embodiment of the present disclosure.

FIG. 3 is a plan view schematically illustrating an example of a substrate equipped with an antenna in which an antenna element is mounted in all of the $W_1$ region in the first embodiment of the present disclosure.

In a substrate equipped with an antenna 1a illustrated in FIG. 3, when viewed from the thickness direction, an end portion of the antenna element 21 overlaps the second outer periphery $B_2$ of the other principal surface B projected onto the one principal surface A. Therefore, the antenna element 21 is mounted in all of the $W_1$ region. Further, the antenna element 21 is mounted in part of the $W_2$ region.

In the substrate equipped with the antenna according to the first embodiment of the present disclosure, it is preferable that the antenna element be mounted in at least part of the $W_2$ region. In this case, the antenna element may be mounted in part of the $W_2$ region, or may be mounted in all of the $W_2$ region. Note that, however, the antenna element may not be mounted in the $W_2$ region.

Figure 4:
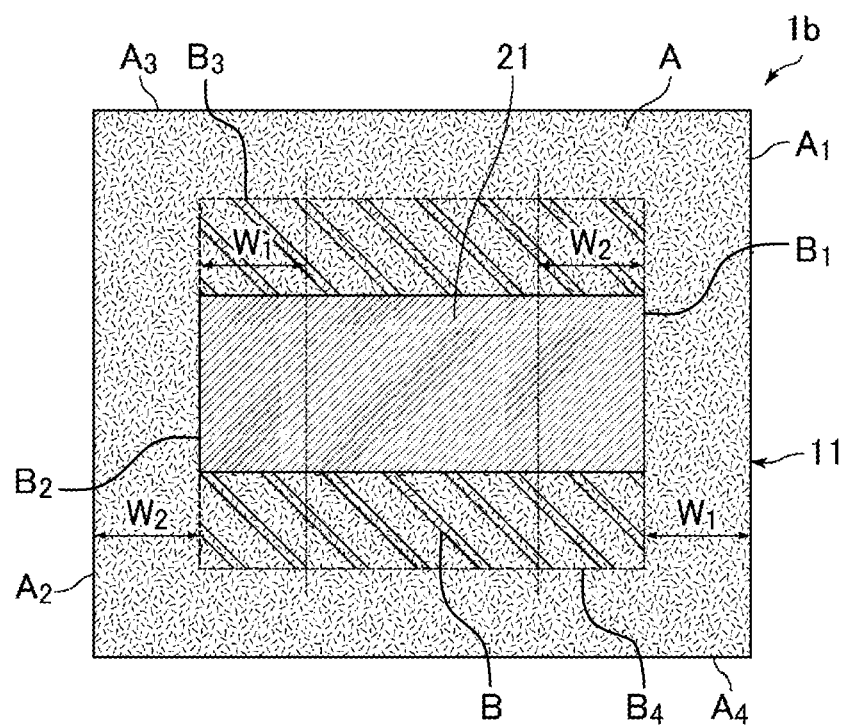
FIG. 4 is a plan view schematically illustrating an example of a substrate equipped with an antenna in which an antenna element is mounted in all of the $W_1$ region and all of a $W_2$ region in the first embodiment of the present disclosure.

FIG. 4 is a plan view schematically illustrating an example of a substrate equipped with an antenna in which an antenna element is mounted in all of the $W_1$ region and all of the $W_2$ region in the first embodiment of the present disclosure.

In a substrate equipped with an antenna 1b illustrated in FIG. 4, when viewed from the thickness direction, an end portion of the antenna element 21 overlaps the second outer periphery $B_2$ of the other principal surface B projected onto the one principal surface A, and another end portion of the antenna element 21 overlaps the first outer periphery $B_1$ of the other principal surface B projected onto the one principal surface A. Therefore, the antenna element 21 is mounted in all of the $W_1$ region and all of the $W_2$ region.

As described above, in the structure of the substrate equipped with the antenna according to the first embodiment of the present disclosure, the antenna element may be formed to have the same width as that of the other principal surface B.

However, it goes without saying that a tolerance shift of the location of the antenna is generated. In the case where a maximum value of the shift is within the width $W_1$ (the antenna is shifted in location but does not stick out from the module, that is, the module is non-defective), the opposite face side is shifted inward by $W_1$. Thus, the width $W_1$ of the projecting region and the $W_1$ region oppose each other.

In the substrate equipped with the antenna according to the first embodiment of the present disclosure, when a maximum width in the first direction between the third outer periphery of the other principal surface projected onto the one principal surface and the third outer periphery of the one principal surface is defined as $W_3$, the antenna element may be mounted in at least part of a region on the one principal surface of the circuit substrate, in which the region has the width $W_3$ (hereinafter also referred to as a $W_3$ region) from the fourth outer periphery of the other principal surface projected onto the one principal surface toward an inner side in the first direction. In this case, the antenna element may be mounted in part of the $W_3$ region, or may be mounted in all of the $W_3$ region.

When a maximum width in the first direction between the fourth outer periphery of the other principal surface projected onto the one principal surface and the fourth outer periphery of the one principal surface is defined as $W_4$, the antenna element may be mounted in at least part of a region on the one principal surface of the circuit substrate, in which the region has the width $W_4$ (hereinafter also referred to as a $W_4$ region) from the third outer periphery of the other principal surface projected onto the one principal surface toward an inner side in the first direction. In this case, the antenna element may be mounted in part of the $W_4$ region, or may be mounted in all of the $W_4$ region.

Figure 5:
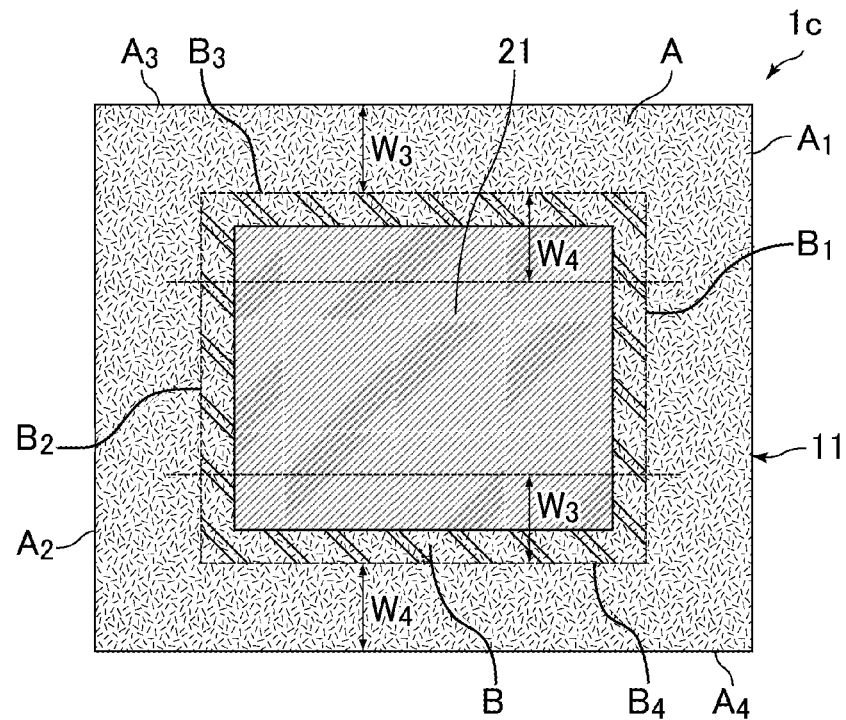
FIG. 5 is a plan view schematically illustrating an example of a substrate equipped with an antenna in which an antenna element is mounted in part of a $W_3$ region and part of a $W_4$ region in the first embodiment of the present disclosure.

FIG. 5 is a plan view schematically illustrating an example of a substrate equipped with an antenna in which an antenna element is mounted in part of the $W_3$ region and part of the $W_4$ region in the first embodiment of the present disclosure.

In a substrate equipped with an antenna 1c illustrated in FIG. 5, the antenna element 21 is mounted in part of the $W_3$ region and part of the $W_4$ region in addition to part of the $W_1$ region and part of the $W_2$ region.

Figure 6:
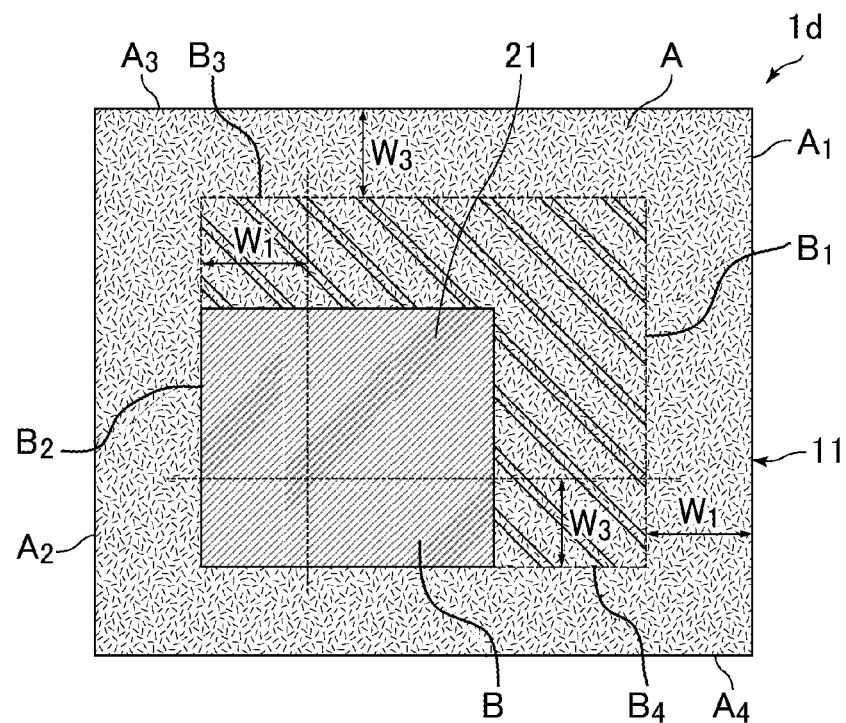
FIG. 6 is a plan view schematically illustrating an example of a substrate equipped with an antenna in which an antenna element is mounted in all of the $W_1$ region and all of the $W_3$ region in the first embodiment of the present disclosure.

FIG. 6 is a plan view schematically illustrating an example of a substrate equipped with an antenna in which an antenna element is mounted in all of the $W_1$ region and all of the $W_3$ region in the first embodiment of the present disclosure.

In a substrate equipped with an antenna 1d illustrated in FIG. 6, when viewed from the thickness direction, an end portion of the antenna element 21 overlaps the second outer periphery $B_2$ of the other principal surface B projected onto the one principal surface A, and another end portion of the antenna element 21 overlaps the fourth outer periphery $B_4$ of the other principal surface B projected onto the one principal surface A. Therefore, the antenna element 21 is mounted in all of the $W_1$ region and all of the $W_3$ region.

In the substrate equipped with the antenna according to the first embodiment of the present disclosure, an end portion of the antenna element may overlap at least the second outer periphery of the other principal surface projected onto the one principal surface when viewed from the thickness direction.

When an end portion of the antenna element overlaps the second outer periphery of the other principal surface, another end portion of the antenna element on the first outer periphery side of the other principal surface may be located in an inner side portion relative to the first outer periphery, or may be located in an outer side portion relative to the first outer periphery.

The end portions of the antenna element may overlap at least the first outer periphery as well as the second outer periphery of the other principal surface projected onto the one principal surface when viewed from the thickness direction. Further, when viewed from the thickness direction, the end portions of the antenna element may overlap all of the first outer periphery, second outer periphery, third outer periphery, and fourth outer periphery of the other principal surface projected onto the one principal surface.

In the substrate equipped with the antenna according to the first embodiment of the present disclosure, the antenna element may not stick out to an outer side portion relative to the other principal surface projected onto the one principal surface or may stick out to the outer side portion, when viewed from the thickness direction.

When viewed from the thickness direction, for example, the end portion of the antenna element on the first outer periphery side of the other principal surface may be located in an inner side portion relative to the first outer periphery, and the end portion of the antenna element on the second outer periphery side of the other principal surface may be located in an outer side portion relative to the second outer periphery.

Figure 7:
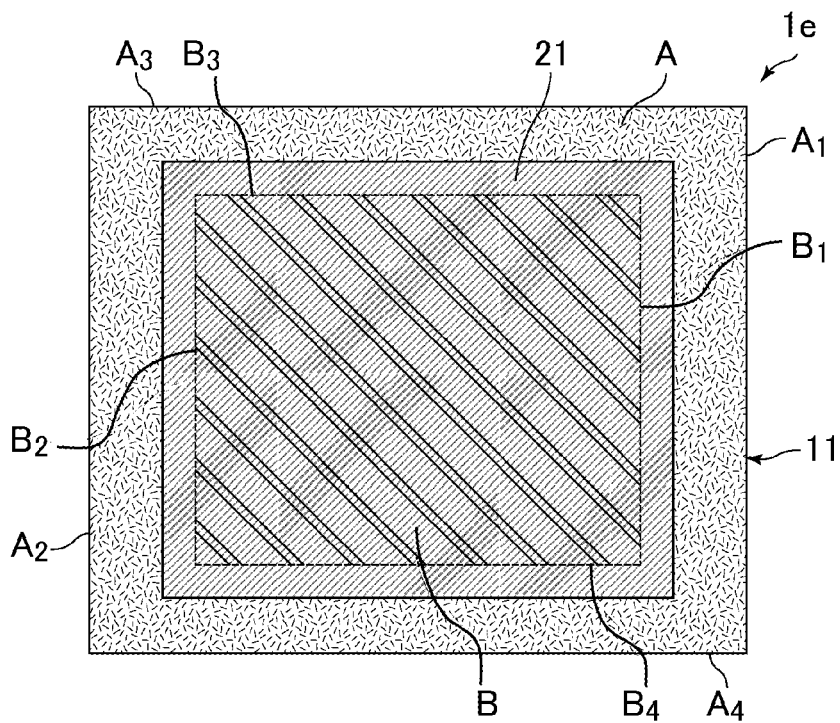
FIG. 7 is a plan view schematically illustrating an example of a substrate equipped with an antenna in which an antenna element sticks out to an outer side portion relative to the other principal surface in the first embodiment of the present disclosure.

FIG. 7 is a plan view schematically illustrating an example of a substrate equipped with an antenna in which an antenna element sticks out to an outer side portion relative to the other principal surface in the first embodiment of the present disclosure.

In a substrate equipped with an antenna 1e illustrated in FIG. 7, the antenna element 21 sticks out to an outer side portion relative to the other principal surface B projected onto the one principal surface A, when viewed from the thickness direction. Even in this case, it may be said that the antenna element 21 is mounted in all of the $W_1$, $W_2$, $W_3$, and $W_4$ regions.

In the substrate equipped with the antenna according to the first embodiment of the present disclosure, the size, shape, and the like of the region where one principal surface of the circuit substrate is projected from the other principal surface thereof are not particularly limited as long as the area of the one principal surface is larger than the area of the other principal surface of the circuit substrate.

Figure 8A:
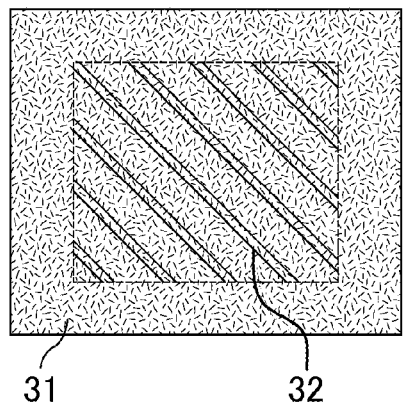
FIG. 8A and FIG. 8B are plan views each schematically illustrating an example of one principal surface of a circuit substrate when viewed from the thickness direction.
Figure 8B:
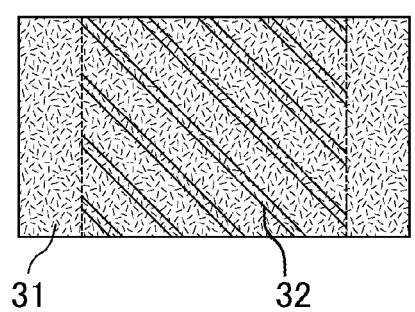

FIG. 8A and FIG. 8B are plan views each schematically illustrating an example of one principal surface of a circuit substrate when viewed from the thickness direction.

In FIG. 8A, the dielectric layer 31 constituting one principal surface of the circuit substrate is projected from four sides of the base material layer 32 constituting the other principal surface of the circuit substrate. On the other hand, in FIG. 8B, the dielectric layer 31 constituting the one principal surface of the circuit substrate is projected from two sides of the base material layer 32 constituting the other principal surface of the circuit substrate.

As described above, one principal surface of the circuit substrate may be projected from four sides of the other principal surface of the circuit substrate, may be projected from three sides thereof, may be projected from two sides thereof, or may be projected from one side thereof. When one principal surface of the circuit substrate is projected from two sides of the other principal surface thereof, the one principal surface may be projected from two sides opposing each other or may be projected from two sides adjacent to each other. Further, one principal surface of the circuit substrate may be projected from part of a side of the other principal surface of the circuit substrate.

In the substrate equipped with the antenna according to the first embodiment of the present disclosure, as illustrated in FIG. 1, the circuit substrate includes a dielectric layer constituting one principal surface and a base material layer constituting the other principal surface. The dielectric layer is a layer having a relative dielectric constant lower than that of the base material layer.

By joining the antenna element and the dielectric layer having a relatively low relative dielectric constant, it is possible to suppress loss of a signal, thereby improving the antenna characteristics.

In the substrate equipped with the antenna according to the first embodiment of the present disclosure, the dielectric layer includes a central portion in contact with the base material layer and a circumferential edge portion located in an outer side portion relative to the central portion, and the circumferential edge portion is thinner than the central portion.

By making the circumferential edge portion thinner than the central portion of the circuit substrate, it is possible to bring the antenna element close to an air region having a low relative dielectric constant in comparison with a case where the circumferential edge portion has the same thickness as the central portion, and thus the antenna characteristics are improved.

Further, since a space can be secured below the projecting portion of the circuit substrate, the degree of freedom in design is enhanced.

Figure 9:
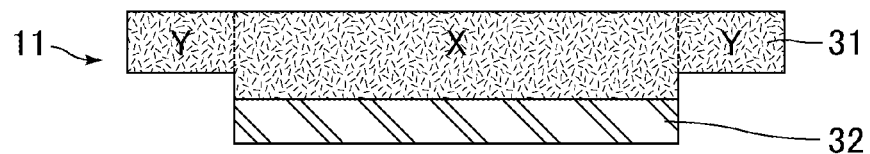
FIG. 9 is a cross-sectional view schematically illustrating an example of a circuit substrate constituting the substrate equipped with the antenna illustrated in FIG. 1.

FIG. 9 is a cross-sectional view schematically illustrating an example of a circuit substrate constituting the substrate equipped with the antenna illustrated in FIG. 1.

As illustrated in FIG. 9, a central portion X of the dielectric layer 31 constituting the circuit substrate 11 is a portion in contact with the base material layer 32, and a circumferential edge portion Y of the dielectric layer 31 is a portion located in an outer side portion relative to the central portion X. In FIG. 9, the circumferential edge portion Y is thinner than the central portion X.

Examples of the material constituting the base material layer include a ceramic material, a resin material, or the like used for constituting a general printed circuit board.

As a ceramic material constituting the base material layer, for example, a low temperature co-fired ceramic (LTCC) material may be used. The low temperature co-fired ceramic material refers to a material, among the ceramic materials, capable of being sintered at a firing temperature of equal to or lower than 1000° C. and capable of being co-fired with copper, silver, or the like.

Examples of the low temperature co-fired ceramic material include a glass composite-based low temperature co-fired ceramic material obtained by mixing a borosilicate glass in a ceramic material such as quartz, alumina, forsterite, or the like; a crystallized glass-based low temperature co-fired ceramic material using a $ZnO$—$MgO$—$Al_2O_3$—$SiO_2$-based crystallized glass; and a non-glass-based low temperature co-fired ceramic material using a $BaO$—$Al_2O_3$—$SiO_2$-based ceramic material, an $Al_2O_3$—$CaO$—$SiO_2$—$MgO$—$B_2O_3$-based ceramic material, or the like.

The relative dielectric constant of the base material layer is, for example, 3 or more and 20 or less.

The thickness of the base material layer is not particularly limited, and is, for example, 100 μm or more and 1000 μm or less.

The material constituting the dielectric layer is preferably a resin material. Examples of such a resin material include a fluorine-based resin, silicone rubber, and a hydrocarbon-based resin having few polar groups (for example, polyethylene, polypropylene, polystyrene, and the like). More preferred specific examples include a fluorine-based resin of $\varepsilon_r \approx 2.6$, silicone rubber of $\varepsilon_r \approx 3.0$, polyethylene of $\varepsilon_r \approx 2.25$, polypropylene of $\varepsilon_r \approx 2.2$, and polystyrene of $\varepsilon_r \approx 2.45$. Note that $\varepsilon_r$ represents a relative dielectric constant.

The relative dielectric constant of the dielectric layer is, for example, 1.5 or more and less than 3.

The thickness of the dielectric layer is not particularly limited as long as the circumferential edge portion is thinner than the central portion; the thickness of the central portion is, for example, 30 μm or more and 500 μm or less, and the thickness of the circumferential edge portion is, for example, 20 μm or more and less than 500 μm.

In the substrate equipped with the antenna according to the first embodiment of the present disclosure, it is preferable that the dielectric layer constituting the circuit substrate be formed by laminating a plurality of layers.

By forming the dielectric layer in a laminated structure, it is possible to form a circuit in the dielectric layer. As a result, it is possible to secure a larger area than that of the base material layer not only for the antenna element but also for the circuit layout, and therefore the degree of freedom in design is enhanced.

When a dielectric layer is formed by laminating layers, a shift in lamination position accuracy, lamination strain, or the like is generated, and thus the above-described problems are exacerbated in the structure of a substrate equipped with an antenna of the related art. In contrast, in the structure of the substrate equipped with the antenna as illustrated in FIGS. 1 and 2, by absorbing the aforementioned tolerances in the projecting portion of the circuit substrate, it is possible to improve the antenna characteristics even in the case where the above shift is generated.

Figure 10:
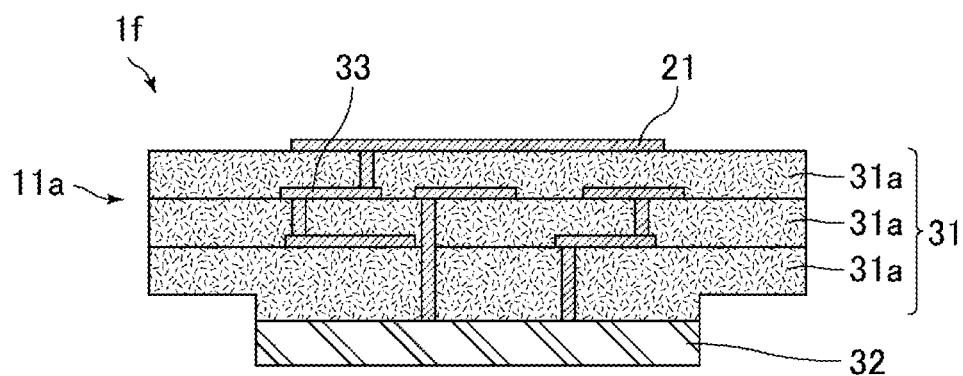
FIG. 10 is a cross-sectional view schematically illustrating an example of a substrate equipped with an antenna including a dielectric layer in a laminated structure in the first embodiment of the present disclosure.

FIG. 10 is a cross-sectional view schematically illustrating an example of a substrate equipped with an antenna including a dielectric layer in a laminated structure in the first embodiment of the present disclosure.

In a substrate equipped with an antenna 1f illustrated in FIG. 10, a circuit substrate 11a includes a dielectric layer 31 and a base material layer 32. In FIG. 10, the dielectric layer 31 is formed by laminating layers 31a having an identical relative dielectric constant in three layers. A circuit 33 is formed in the dielectric layer 31.

In the substrate equipped with the antenna according to the first embodiment of the present disclosure, the dielectric layer constituting the circuit substrate may be formed by laminating two or more kinds of layers having different relative dielectric constants, and the relative dielectric constant of the layer constituting one principal surface of the circuit substrate may be lowest in the dielectric layer.

For example, it is preferable that a layer having a high relative dielectric constant be provided in the layers other than a surface layer. It is also preferable that a layer having a high relative dielectric constant be sandwiched between the layers each having a low relative dielectric constant.

By providing a layer having a high relative dielectric constant in the layers other than the surface layer, the strength of the substrate equipped with the antenna may be reinforced.

Figure 11:
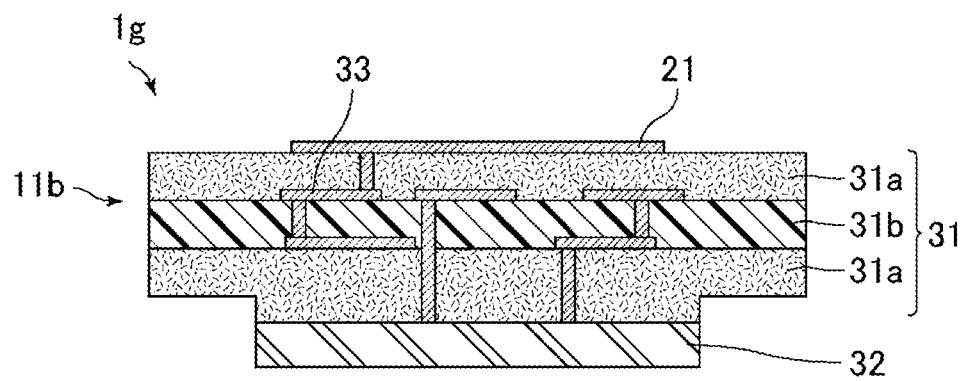
FIG. 11 is a cross-sectional view schematically illustrating another example of a substrate equipped with an antenna including a dielectric layer in the laminated structure in the first embodiment of the present disclosure.

FIG. 11 is a cross-sectional view schematically illustrating another example of a substrate equipped with an antenna including a dielectric layer in the laminated structure in the first embodiment of the present disclosure.

In a substrate equipped with an antenna 1g illustrated in FIG. 11, a circuit substrate 11b includes a dielectric layer 31 and a base material layer 32. In FIG. 11, the dielectric layer 31 is formed by layers 31a having a low relative dielectric constant sandwiching a layer 31b having a high relative dielectric constant therebetween. A circuit 33 is formed in the dielectric layer 31.

In the substrate equipped with the antenna according to the first embodiment of the present disclosure, it is preferable that a step portion between a projecting portion and a non-projecting portion of the circuit substrate have a chamfered shape.

In this case, since the stress due to thermal deformation is easily dispersed, reliability regarding impact resistance, thermal shock resistance, and the like is improved.

The term "chamfer" used herein refers to forming a surface over a recess of the step portion, that is, attaching some material to the recess of the step portion.

Figure 12:
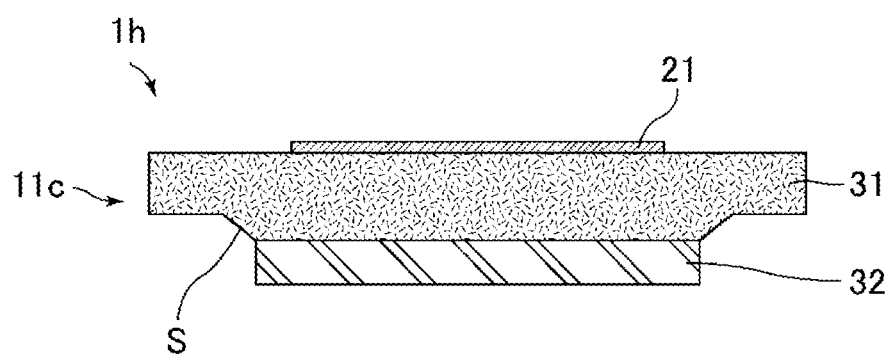
FIG. 12 is a cross-sectional view schematically illustrating an example of a substrate equipped with an antenna in which a step portion has a chamfered shape in the first embodiment of the present disclosure.

FIG. 12 is a cross-sectional view schematically illustrating an example of a substrate equipped with an antenna in which a step portion has a chamfered shape in the first embodiment of the present disclosure.

In a substrate equipped with an antenna 1h illustrated in FIG. 12, a step portion S of a circuit substrate 11c has a C-chamfered shape in which a cross section thereof is represented by a straight line. In the substrate equipped with the antenna 1h illustrated in FIG. 12, the step portion S is located in a dielectric layer 31, and the dielectric layer 31 is attached to the recess of the step portion S.

The chamfered shape of the step portion is not particularly limited, and examples thereof include a C-chamfered shape in which the cross section is represented by a straight line, and an R-chamfered shape in which the cross section is represented by a curved line. The step portion having a chamfered shape is formed by, for example, cutting processing, polishing processing, or the like.

Second Embodiment

In a second embodiment of the present disclosure, a circuit substrate includes a dielectric layer constituting one principal surface and a base material layer constituting the other principal surface, and a circumferential edge portion of the dielectric layer has the same thickness as that of a central portion thereof.

Figure 13:
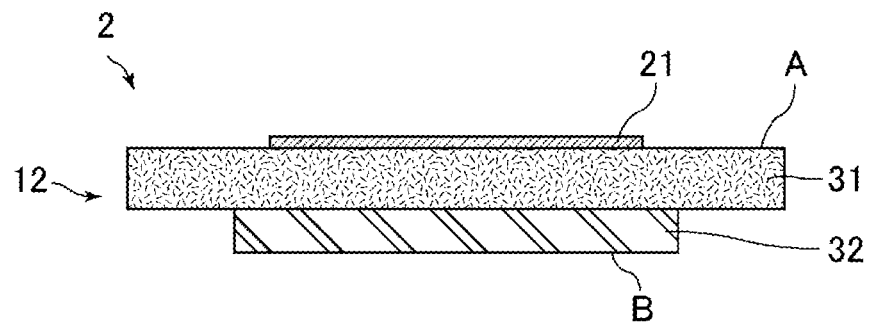
FIG. 13 is a cross-sectional view schematically illustrating an example of a substrate equipped with an antenna according to a second embodiment of the present disclosure.

FIG. 13 is a cross-sectional view schematically illustrating an example of a substrate equipped with an antenna according to the second embodiment of the present disclosure.

A substrate equipped with an antenna 2 illustrated in FIG. 13 includes a circuit substrate 12 and an antenna element 21. The circuit substrate 12 has one principal surface A and the other principal surface B, and the antenna element 21 is mounted on the one principal surface A of the circuit substrate 12. The circuit substrate 12 includes a dielectric layer 31 constituting the one principal surface A, and a base material layer 32 constituting the other principal surface B.

In the substrate equipped with the antenna 2 illustrated in FIG. 13, a circumferential edge portion of the dielectric layer 31 has the same thickness as that of a central portion thereof. The other constituent elements are the same as those of the substrate equipped with the antenna 1 illustrated in FIG. 1.

The substrate equipped with the antenna according to the second embodiment of the present disclosure has a configuration common to the substrate equipped with the antenna according to the first embodiment of the present disclosure except that the circumferential edge portion of the dielectric layer has the same thickness as that of the central portion thereof.

The thickness of the dielectric layer is not particularly limited as long as the thickness of the circumferential edge portion is the same as the thickness of the central portion, and the thickness is, for example, 20 μm or more and 500 μm or less.

In the second embodiment of the present disclosure, it is acceptable that the thickness of the circumferential edge portion of the dielectric layer is not strictly the same as the thickness of the central portion of the dielectric layer. Specifically, it is sufficient that the thickness of the circumferential edge portion of the dielectric layer falls within a range of about 5% of the thickness of the central portion of the dielectric layer.

In the substrate equipped with the antenna according to the second embodiment of the present disclosure, it is preferable that the dielectric layer constituting the circuit substrate be formed by laminating a plurality of layers.

In the substrate equipped with the antenna according to the second embodiment of the present disclosure, the dielectric layer constituting the circuit substrate may be formed by laminating two or more kinds of layers having different relative dielectric constants, and the relative dielectric constant of the layer constituting one principal surface of the circuit substrate may be lowest in the dielectric layer.

In the substrate equipped with the antenna according to the second embodiment of the present disclosure, it is preferable that a step portion between a projecting portion and a non-projecting portion of the circuit substrate have a chamfered shape. For example, in the substrate equipped with the antenna 2 illustrated in FIG. 13, it is preferable that the base material layer 32 be attached to a recess of a step portion located between the dielectric layer 31 and the base material layer 32.

Third Embodiment

In a third embodiment of the present disclosure, a circuit substrate includes a dielectric layer constituting one principal surface and the other principal surface.

Figure 14:
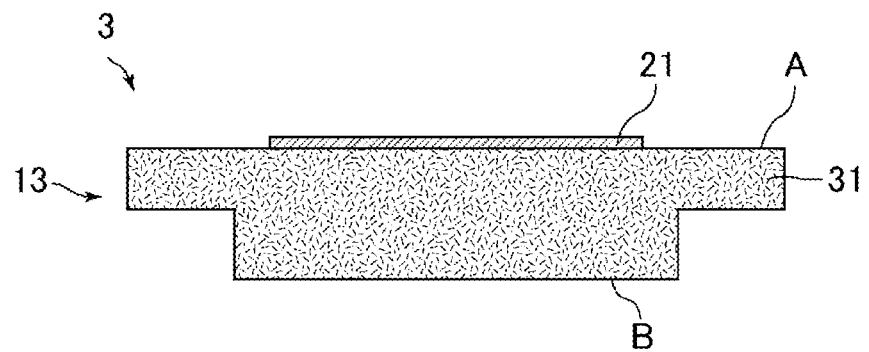
FIG. 14 is a cross-sectional view schematically illustrating an example of a substrate equipped with an antenna according to a third embodiment of the present disclosure.

FIG. 14 is a cross-sectional view schematically illustrating an example of a substrate equipped with an antenna according to the third embodiment of the present disclosure.

A substrate equipped with an antenna 3 illustrated in FIG. 14 includes a circuit substrate 13 and an antenna element 21. The circuit substrate 13 has one principal surface A and the other principal surface B, and the antenna element 21 is mounted on the one principal surface A of the circuit substrate 13. The circuit substrate 13 includes a dielectric layer 31 constituting the one principal surface A and the other principal surface B. The other constituent elements are the same as those of the substrate equipped with the antenna 1 illustrated in FIG. 1.

The substrate equipped with the antenna according to the third embodiment of the present disclosure has a configuration common to the substrate equipped with the antenna according to the first embodiment of the present disclosure except that the circuit substrate is not provided with a base material layer.

The thickness of the dielectric layer is not particularly limited; the thickness of a projecting portion is, for example, 20 μm or more and 500 μm or less, and the thickness of a non-projecting portion is, for example, 100 μm or more and 1000 μm or less.

In the substrate equipped with the antenna according to the third embodiment of the present disclosure, it is preferable that the dielectric layer constituting the circuit substrate be formed by laminating a plurality of layers.

In the substrate equipped with the antenna according to the third embodiment of the present disclosure, the dielectric layer constituting the circuit substrate may be formed by laminating two or more kinds of layers having different relative dielectric constants, and the relative dielectric constant of the layer constituting one principal surface of the circuit substrate may be lowest in the dielectric layer.

In the substrate equipped with the antenna according to the third embodiment of the present disclosure, it is preferable that a step portion between a projecting portion and a non-projecting portion of the circuit substrate have a chamfered shape. For example, in the substrate equipped with the antenna 3 illustrated in FIG. 14, it is preferable that the dielectric layer 31 be attached to a recess of a step portion located in the dielectric layer 31.

[Antenna Module]

An antenna module of the present disclosure includes a substrate equipped with an antenna, and an electronic component mounted on the substrate equipped with the antenna, wherein the antenna module includes, as the substrate equipped with the antenna, the substrate equipped with the antenna of the present disclosure.

In the substrate equipped with the antenna of the present disclosure, there exists a space below a projecting portion of a circuit substrate. Due to this, when the antenna module of the present disclosure is mounted on a mounting substrate, a space for mounting other electronic components is secured, and it is possible to effectively utilize the space on the mounting substrate.

Figure 15:
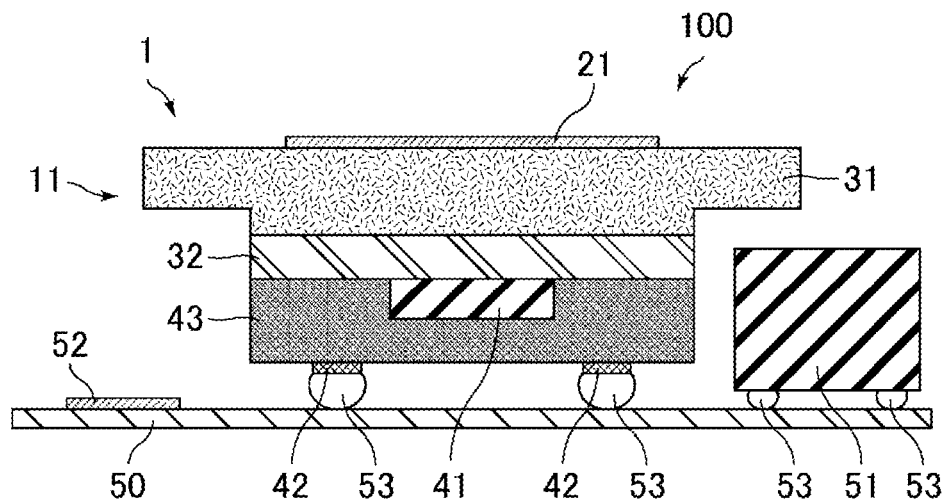
FIG. 15 is a cross-sectional view schematically illustrating an example of a state in which an antenna module of the present disclosure is mounted on a mounting substrate.

FIG. 15 is a cross-sectional view schematically illustrating an example of a state in which an antenna module of the present disclosure is mounted on a mounting substrate. FIG. 15 illustrates, as an example of an antenna module of the present disclosure, an antenna module using the substrate equipped with the antenna 1 illustrated in FIG. 1.

An antenna module 100 illustrated in FIG. 15 includes the substrate equipped with the antenna 1 in which the antenna element 21 is mounted on one principal surface of the circuit substrate 11, and an electronic component 41 mounted on the substrate equipped with the antenna 1. The configuration of the substrate equipped with the antenna 1 is the same as described in FIG. 1.

In the antenna module 100 illustrated in FIG. 15, the electronic component 41 is mounted on the other principal surface of the circuit substrate 11, that is, on the principal surface on the opposite side to the principal surface on which the antenna element 21 is mounted. The electronic component 41 is mounted on the circuit substrate 11 with a bonding material (not illustrated) such as solder interposed therebetween.

In the antenna module 100 illustrated in FIG. 15, external terminals 42 are further provided on the other principal surface of the circuit substrate 11. The electronic component 41 is sealed by a sealing material 43.

In FIG. 15, the antenna module 100 is mounted on a mounting substrate 50. Another electronic component 51 is mounted on the mounting substrate 50, and a surface layer wiring line 52 is provided thereon. The antenna module 100 and the other electronic component 51 are respectively mounted on the mounting substrate 50 with bonding materials 53 such as solder interposed therebetween.

An example of each of the electronic component mounted on the substrate equipped with the antenna and the electronic component mounted on the mounting substrate includes a surface mount component (SMC) such as an integrated circuit (IC). From the viewpoint of increasing an effective area of the antenna element, it is preferable that the electronic component to be mounted on the substrate equipped with the antenna be mounted on the other principal surface of the circuit substrate.

It is preferable that the external terminals to be provided on the substrate equipped with the antenna, similarly to the above electronic component, be provided on the other principal surface of the circuit substrate.

The antenna module discussed above may be appropriately used in a next-generation radio base station, a mobile terminal, and the like of 5G or WiGig, for example.

The substrate equipped with the antenna and the antenna module of the present disclosure are preferably manufactured as follows. Hereinafter, examples of the manufacture of the substrate equipped with the antenna according to the first embodiment of the present disclosure, and the antenna module including the substrate equipped with the antenna will be described.

Manufacture Example 1

(1) A film to be a dielectric layer is attached onto a surface of a base material layer. An area of the film to be attached onto the base material layer is equal to that of the base material layer.

As the base material layer, a general printed circuit board, an LTCC substrate, a polyimide sheet, or the like may be used.

As a film to be a dielectric layer, for example, a film containing the above-described resin material as a main ingredient may be used.

The film to be a dielectric layer is attached through processes such as heating, pressurization, and UV irradiation.

(2) One or more layers of films to be the dielectric layer are further laminated on the film having been attached to the base material layer. The area of each of the films to be laminated is larger than the area of the base material layer. This makes it possible to cause an area of one principal surface of the circuit substrate to be larger than that of the other principal surface thereof.

An antenna element is formed on the film that is laminated on the uppermost surface layer. At this time, the antenna element is so formed as to be mounted in the $W_1$ region.

The antenna element is formed by photolithography, plating, pressure bonding, or the like. The antenna element may be formed before the lamination or after the lamination.

In the manner described above, the substrate equipped with the antenna is provided.

(3) An electronic component such as an IC is mounted and external terminals are formed, on a principal surface on the opposite side to the antenna element forming surface of the substrate equipped with the antenna achieved. Then, the mounting surface is sealed with resin by using a sealing material.

The electronic component may be mounted by using a general mounting process. For the sealing with resin, a process such as transfer molding, compression molding, liquid resin dipping, or the like may be used.

(4) Washing, printing, measurement, appearance inspection, and packaging are carries out for the shipment as needed. As described above, the antenna module is provided.

Manufacture Example 2

(1) An antenna element is formed on a film to be a dielectric layer. At this time, the antenna element is so formed as to be mounted in a portion to become the $W_1$ region in a process to be carried out later.

(2) The film on which the antenna element is formed is attached onto a surface of a base material layer.

(3) An electronic component such as an IC is mounted and external terminals are formed, on a principal surface on the opposite side to the antenna element forming surface. Then, the mounting surface is sealed with resin by using a sealing material. In this manner, a module product is provided.

(4) The achieved module product is cut with a dicing machine. First, cutting into the module product is performed from the terminal surface side with a blade having a thick width. However, part of the dielectric layer is allowed to remain, so that the individual pieces are connected to each other by the dielectric layer in a state of being not completely singulated. The remaining dielectric layer becomes a projecting portion of the circuit substrate.

(5) Next, cutting into the module product is performed with a blade having a thinner width than the width of the blade with which the cutting has been made first, so that the module product is completely singulated. A step is formed by making a difference in width between the thick blade and the thin blade, thereby making it possible for the area of one principal surface of the circuit substrate to be larger than the area of the other principal surface thereof.

(6) With respect to the singulated modules, washing, printing, measurement, appearance inspection, and packaging are carried out for the shipment as needed. As described above, the antenna module is provided.

The substrate equipped with the antenna and the antenna module of the present disclosure are not limited to the above-described embodiments, and it is possible to add various applications and modifications within the scope of the present disclosure, regarding, for example, the configuration and manufacturing conditions of the substrate equipped with the antenna.

Working Examples

Hereinafter, working examples will be described in which a substrate equipped with an antenna and an antenna module of the present disclosure are disclosed more specifically. Note that the present disclosure is not limited to these working examples only.

[Production of Substrate Equipped with Antenna]

Under the conditions indicated in Table 1, substrates equipped with antennas each having the same structure as that in FIG. 13 were produced.

The structure of each substrate equipped with an antenna having been produced is given below.

Material of base material layer: LTCC ($\varepsilon$=7 to 8)
Thickness of base material layer: 1 mm
Area of base material layer (terminal surface): 3 mm×3 mm
Material of dielectric layer: fluorine-based resin ($\varepsilon$=2.5)
Thickness of dielectric layer: 1 mm (central portion), 1 mm (circumferential edge portion)
Area of dielectric layer: see Table 1
Area of antenna element: see Table 1

Figure 16:
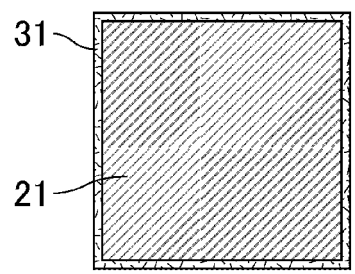
FIG. 16 is a plan view of a substrate equipped with an antenna manufactured under Condition 1.
Figure 17:
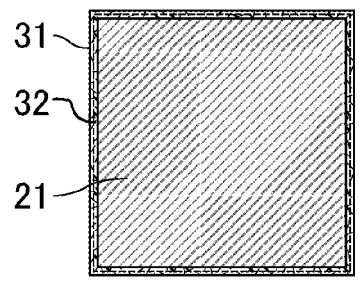
FIG. 17 is a plan view of a substrate equipped with an antenna manufactured under Condition 2.
Figure 18:
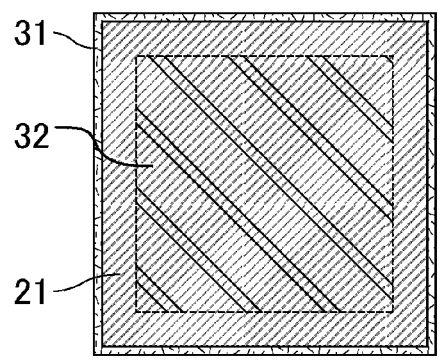
FIG. 18 is a plan view of a substrate equipped with an antenna manufactured under Condition 5.

FIG. 16 is a plan view of a substrate equipped with an antenna produced under Condition 1, FIG. 17 is a plan view of a substrate equipped with an antenna produced under Condition 2, and FIG. 18 is a plan view of a substrate equipped with an antenna produced under Condition 5.

Under Conditions 1 to 5, the area of the base material layer 32 was made constant, and the area of the dielectric layer 31 and the area of the antenna element 21 were respectively changed. The antenna elements 21 was disposed in a central portion of the dielectric layer 31 under any condition.

[Evaluation of Antenna Characteristics]

Antenna modules were produced by using the substrates equipped with the antennas having been achieved. For each of the antenna modules, a specific signal was transmitted from a signal transmitter device, and the signal intensity at the reception time was checked.

The signal intensities under Conditions 2 to 5 were compared while taking the signal intensity under Condition 1 as the reference. When compared to the signal intensity under Condition 1, a case in which the signal intensity is less than 100% was determined to be "x" (poor), a case in which the signal intensity is 100% or more and less than 105% was determined to be "◯" (good), and a case in which the signal intensity is 105% or more was determined to be "⊙" (excellent).

TABLE 1

| Condition | Area of base material Layer (mm) | Area of dielectric layer (mm) | Area of antenna (mm) | Signal intensity ratio (reference:signal intensity under Condition 1) | Determination |
|---|---|---|---|---|---|
| *1 | 3 × 3 | 3 × 3 | 2.8 × 2.8 | 100% | — |
| 2 |  | 3.1 × 3.1 | 2.9 × 2.9 | 103% | ◯ |
| 3 |  | 3.3 × 3.3 | 3.1 × 3.1 | 114% | ⊙ |

TABLE 1-continued

| Condition | Area of base material Layer (mm) | Area of dielectric layer (mm) | Area of antenna (mm) | Signal intensity ratio (reference:signal intensity under Condition 1) | Determination |
|---|---|---|---|---|---|
| 4 | | 3.5 × 3.5 | 3.3 × 3.3 | 137% | ⊙ |
| 5 | | 4 × 4 | 3.8 × 3.8 | 171% | ⊙ |

In Table 1, the description of a row in which the symbol "*" is added to the condition number is a comparative example outside the scope of the present disclosure.

Under Conditions 2 to 5, since the area of the dielectric layer is larger than the area of the base material layer, a region projecting relative to the other principal surface is present on the one principal surface of the circuit substrate.

Under Condition 2, by providing the projecting region on the one principal surface of the circuit substrate, the area of the antenna element was allowed to be larger than that under Condition 1, thereby improving the antenna characteristics as compared to Condition 1. In particular, under Conditions 3 to 5, in each of which the antenna element is mounted in the projecting region, the antenna characteristics are significantly improved as compared to Condition 1. The area and the signal intensity of the antenna element have a substantially proportional relationship between each other.

1, 1a, 1b, 1c, 1d, 1e, 1f, 1g, 1h, 2, 3 SUBSTRATE EQUIPPED WITH ANTENNA
11, 11a, 11b, 11c, 12, 13 CIRCUIT SUBSTRATE
21 ANTENNA ELEMENT
31, 31a, 31b DIELECTRIC LAYER
32 BASE MATERIAL LAYER
33 CIRCUIT
41 ELECTRONIC COMPONENT (ELECTRONIC COMPONENT TO BE MOUNTED ON SUBSTRATE EQUIPPED WITH ANTENNA)
42 EXTERNAL TERMINAL
43 SEALING MATERIAL
50 MOUNTING SUBSTRATE
51 ELECTRONIC COMPONENT (ELECTRONIC COMPONENT TO BE MOUNTED ON MOUNTING SUBSTRATE)
52 SURFACE LAYER WIRING LINE
53 BONDING MATERIAL
100 ANTENNA MODULE
A ONE PRINCIPAL SURFACE OF CIRCUIT SUBSTRATE
$A_1$ FIRST OUTER PERIPHERY OF ONE PRINCIPAL SURFACE
$A_2$ SECOND OUTER PERIPHERY OF ONE PRINCIPAL SURFACE
$A_3$ THIRD OUTER PERIPHERY OF ONE PRINCIPAL SURFACE
$A_4$ FOURTH OUTER PERIPHERY OF ONE PRINCIPAL SURFACE
B THE OTHER PRINCIPAL SURFACE OF CIRCUIT SUBSTRATE
$B_1$ FIRST OUTER PERIPHERY OF THE OTHER PRINCIPAL SURFACE
$B_2$ SECOND OUTER PERIPHERY OF THE OTHER PRINCIPAL SURFACE
$B_3$ THIRD OUTER PERIPHERY OF THE OTHER PRINCIPAL SURFACE
$B_4$ FOURTH OUTER PERIPHERY OF THE OTHER PRINCIPAL SURFACE
S STEP PORTION
$W_1$ MAXIMUM WIDTH BETWEEN FIRST OUTER PERIPHERY $B_1$ OF THE OTHER PRINCIPAL SURFACE B AND FIRST OUTER PERIPHERY $A_1$ OF ONE PRINCIPAL SURFACE A
$W_2$ MAXIMUM WIDTH BETWEEN SECOND OUTER PERIPHERY $B_2$ OF THE OTHER PRINCIPAL SURFACE B AND SECOND OUTER PERIPHERY $A_2$ OF ONE PRINCIPAL SURFACE A
$W_3$ MAXIMUM WIDTH BETWEEN THIRD OUTER PERIPHERY $B_3$ OF THE OTHER PRINCIPAL SURFACE B AND THIRD OUTER PERIPHERY $A_3$ OF ONE PRINCIPAL SURFACE A
$W_4$ MAXIMUM WIDTH BETWEEN FOURTH OUTER PERIPHERY $B_4$ OF THE OTHER PRINCIPAL SURFACE B AND FOURTH OUTER PERIPHERY $A_4$ OF ONE PRINCIPAL SURFACE A
X CENTRAL PORTION OF DIELECTRIC LAYER
Y CIRCUMFERENTIAL EDGE PORTION OF DIELECTRIC LAYER

The invention claimed is:

1. A substrate equipped with an antenna, the substrate comprising:
   a circuit substrate having one principal surface and another principal surface; and
   an antenna element mounted on the one principal surface of the circuit substrate,
   wherein an area of the one principal surface is larger than another area of the other principal surface of the circuit substrate when viewed from a thickness direction,
   each of the one principal surface and the other principal surface of the circuit substrate has a rectangular shape, and respectively includes a first outer periphery and a second outer periphery in pairs extending along a first direction, and a third outer periphery and a fourth outer periphery in pairs extending along a second direction, and
   when a maximum width in the second direction between the first outer periphery of the other principal surface projected onto the one principal surface and the first outer periphery of the one principal surface is defined as $W_1$, the antenna element is mounted in at least a part of a region on the one principal surface of the circuit substrate, the region having the width $W_1$ from the second outer periphery of the other principal surface projected onto the one principal surface toward an inner side in the second direction.

2. The substrate equipped with the antenna according to claim 1,
   wherein, when a maximum width in the second direction between the second outer periphery of the other principal surface projected onto the one principal surface and the second outer periphery of the one principal surface is defined as $W_2$, the antenna element is mounted in at least a part of a region on the one principal surface of the circuit substrate, the region having the width $W_2$ from the first outer periphery of the other principal surface projected onto the one principal surface toward an inner side in the second direction.

3. The substrate equipped with the antenna according to claim 1,
wherein an end portion of the antenna element overlaps at least the second outer periphery of the other principal surface projected onto the one principal surface when viewed from the thickness direction.

4. The substrate equipped with the antenna according to claim 2,
wherein end portions of the antenna element overlap, at least, the first outer periphery and the second outer periphery of the other principal surface projected onto the one principal surface when viewed from the thickness direction.

5. The substrate equipped with the antenna according to claim 1,
wherein the antenna element does not stick out to an outer side portion relative to the other principal surface projected onto the one principal surface when viewed from the thickness direction.

6. The substrate equipped with the antenna according to claim 1,
wherein the circuit substrate includes a dielectric layer constituting the one principal surface, and a base material layer constituting the other principal surface,
the dielectric layer has a relative dielectric constant lower than a relative dielectric constant of the base material layer, and
the dielectric layer has a central portion in contact with the base material layer, and a circumferential edge portion located in an outer side portion relative to the central portion.

7. The substrate equipped with the antenna according to claim 6,
wherein the circumferential edge portion is thinner than the central portion.

8. The substrate equipped with the antenna according to claim 6,
wherein the circumferential edge portion and the central portion have the same thickness.

9. The substrate equipped with the antenna according to claim 1,
wherein the circuit substrate includes a dielectric layer constituting the one principal surface and the other principal surface.

10. The substrate equipped with the antenna according to claim 6,
wherein the dielectric layer comprises a plurality of laminated layers.

11. The substrate equipped with the antenna according to claim 6,
wherein the dielectric layer comprises two or more kinds of laminated layers having different relative dielectric constants, and the relative dielectric constant of the layer constituting the one principal surface is lowest in the dielectric layer.

12. The substrate equipped with the antenna according to claim 1,
wherein a step portion between a projecting portion and a non-projecting portion of the circuit substrate has a chamfered shape.

13. An antenna module comprising:
the substrate equipped with the antenna according to claim 1; and
an electronic component mounted on the substrate equipped with the antenna.

14. The antenna module according to claim 13,
wherein the electronic component is mounted on the other principal surface of the circuit substrate.

15. The substrate equipped with the antenna according to claim 2,
wherein an end portion of the antenna element overlaps at least the second outer periphery of the other principal surface projected onto the one principal surface when viewed from the thickness direction.

16. The substrate equipped with the antenna according to claim 2,
wherein the circuit substrate includes a dielectric layer constituting the one principal surface, and a base material layer constituting the other principal surface,
the dielectric layer has a relative dielectric constant lower than a relative dielectric constant of the base material layer, and
the dielectric layer has a central portion in contact with the base material layer, and a circumferential edge portion located in an outer side portion relative to the central portion.

17. The substrate equipped with the antenna according to claim 3,
wherein the circuit substrate includes a dielectric layer constituting the one principal surface, and a base material layer constituting the other principal surface,
the dielectric layer has a relative dielectric constant lower than a relative dielectric constant of the base material layer, and
the dielectric layer has a central portion in contact with the base material layer, and a circumferential edge portion located in an outer side portion relative to the central portion.

18. The substrate equipped with the antenna according to claim 3,
wherein the circuit substrate includes a dielectric layer constituting the one principal surface, and a base material layer constituting the other principal surface,
the dielectric layer has a relative dielectric constant lower than a relative dielectric constant of the base material layer, and
the dielectric layer has a central portion in contact with the base material layer, and a circumferential edge portion located in an outer side portion relative to the central portion.

19. The substrate equipped with the antenna according to claim 4,
wherein the circuit substrate includes a dielectric layer constituting the one principal surface, and a base material layer constituting the other principal surface,
the dielectric layer has a relative dielectric constant lower than a relative dielectric constant of the base material layer, and
the dielectric layer has a central portion in contact with the base material layer, and a circumferential edge portion located in an outer side portion relative to the central portion.

20. The substrate equipped with the antenna according to claim 5,
wherein the circuit substrate includes a dielectric layer constituting the one principal surface, and a base material layer constituting the other principal surface,
the dielectric layer has a relative dielectric constant lower than a relative dielectric constant of the base material layer, and the dielectric layer has a central portion in contact with the base material layer, and a circumferential edge portion located in an outer side portion relative to the central portion.

* * * * *